US010776535B2

(12) United States Patent
Gintis

(10) Patent No.: US 10,776,535 B2
(45) Date of Patent: Sep. 15, 2020

(54) METHODS, SYSTEMS AND COMPUTER READABLE MEDIA FOR TESTING NETWORK DEVICES USING VARIABLE TRAFFIC BURST PROFILES

(71) Applicant: Keysight Technologies Singapore (Sales) Pte. Ltd., Singapore (SG)

(72) Inventor: Noah Steven Gintis, Westlake Village, CA (US)

(73) Assignee: Keysight Technologies Singapore (Sales) Pte. Ltd., Singapore (SG)

( * ) Notice: Subject to any disclaimer, the term of this patent is extended or adjusted under 35 U.S.C. 154(b) by 607 days.

(21) Appl. No.: 15/207,412

(22) Filed: Jul. 11, 2016

(65) Prior Publication Data

US 2018/0011955 A1    Jan. 11, 2018

(51) Int. Cl.
*G06F 30/20* (2020.01)
*H04L 12/24* (2006.01)
*H04L 12/26* (2006.01)

(52) U.S. Cl.
CPC .............. *G06F 30/20* (2020.01); *H04L 41/00* (2013.01); *H04L 43/00* (2013.01); *H04L 43/14* (2013.01)

(58) Field of Classification Search
None
See application file for complete search history.

(56) References Cited

U.S. PATENT DOCUMENTS 5,526,283 A    6/1996  Hershey et al.
5,557,559 A *  9/1996  Rhodes ............ G01R 31/31719
                                                    324/750.05
5,568,471 A    10/1996 Hershey et al.
5,586,266 A    12/1996 Hershey et al.
5,671,351 A    9/1997  Wild et al.
5,761,486 A    6/1998  Watanabe et al.
5,787,147 A    7/1998  Gundersen
5,812,529 A    9/1998  Czarnik et al.

(Continued)

FOREIGN PATENT DOCUMENTS

EP    0 895 375 A2    2/1999
EP    1 465 367 A1    10/2004

(Continued)

OTHER PUBLICATIONS

"Ethernet Traffic Generation," 2013, ALBEDO Telecom, 17 pages (Year: 2013).*

(Continued)

*Primary Examiner* — Kamini S Shah
*Assistant Examiner* — Russ Guill

(57) ABSTRACT

A method for testing a network device using a variable traffic burst profile includes providing for user selection of at least one type of simulated traffic to be transmitted to a network device under test (DUT). The method further includes receiving user input regarding selection of the type of simulated traffic. The method further includes providing for user selection of a transmission rate for transmitting the simulated traffic to the DUT. The method further includes receiving user input regarding selection of the transmission rate. The method further includes transmitting the simulated traffic to the DUT according to the selected traffic type, the selected transmission rate, and a variable traffic burst profile.

17 Claims, 5 Drawing Sheets

(56) References Cited

U.S. PATENT DOCUMENTS

| | | | |
|---|---|---|---|
| 5,905,713 A | 5/1999 | Anderson et al. | |
| 6,028,847 A | 2/2000 | Beanland | |
| 6,137,782 A | 10/2000 | Sharon et al. | |
| 6,148,277 A | 11/2000 | Asava et al. | |
| 6,172,989 B1 | 1/2001 | Yanagihara et al. | |
| 6,173,333 B1 | 1/2001 | Jolitz et al. | |
| 6,252,872 B1 | 6/2001 | Tzeng | |
| 6,321,264 B1 | 11/2001 | Fletcher et al. | |
| 6,343,078 B1 | 1/2002 | Bronstein et al. | |
| 6,414,942 B1 | 7/2002 | Ito et al. | |
| 6,507,923 B1 | 1/2003 | Wall et al. | |
| 6,526,259 B1 | 2/2003 | Ho | |
| 6,580,707 B1 | 6/2003 | Ikeda et al. | |
| 6,601,020 B1 | 7/2003 | Myers | |
| 6,606,721 B1 | 8/2003 | Gowin, Jr. et al. | |
| 6,621,805 B1 | 9/2003 | Kondylis et al. | |
| 6,744,783 B1 | 6/2004 | Tzeng | |
| 6,789,100 B2 | 9/2004 | Nemirovsky et al. | |
| 6,798,746 B1 | 9/2004 | Kloth et al. | |
| 6,950,405 B2 | 9/2005 | Van Gerrevink | |
| 6,990,529 B2 | 1/2006 | Yang et al. | |
| 7,002,918 B1 | 2/2006 | Prieto, Jr. et al. | |
| 7,161,902 B2 | 1/2007 | Carter et al. | |
| 7,257,082 B2 | 8/2007 | Dugatkin | |
| 9,001,688 B2 | 4/2015 | Dragulescu et al. | |
| 2001/0039590 A1 | 11/2001 | Furukawa et al. | |
| 2002/0015387 A1 | 2/2002 | Houh | |
| 2002/0037008 A1 | 3/2002 | Tagami et al. | |
| 2002/0080781 A1 | 6/2002 | Gustavsson | |
| 2002/0093917 A1 | 7/2002 | Knobbe et al. | |
| 2002/0105911 A1 | 8/2002 | Pruthi et al. | |
| 2002/0138226 A1 | 9/2002 | Doane | |
| 2002/0177977 A1 | 11/2002 | Scarlat et al. | |
| 2003/0012141 A1 | 1/2003 | Gerrevink | |
| 2003/0043434 A1 | 3/2003 | Brachmann et al. | |
| 2003/0099243 A1 | 5/2003 | Oh et al. | |
| 2003/0172177 A1 | 9/2003 | Kersley et al. | |
| 2003/0179777 A1 | 9/2003 | Denton et al. | |
| 2004/0083208 A1* | 4/2004 | Kroening | G06F 16/51 |
| 2005/0025054 A1* | 2/2005 | D. | H04L 43/50 370/235 |
| 2005/0027503 A1 | 2/2005 | Kumar et al. | |
| 2007/0291650 A1 | 12/2007 | Ormazabal | |
| 2009/0034596 A1 | 2/2009 | Chen et al. | |
| 2009/0059804 A1* | 3/2009 | Fujikami | H04L 43/50 370/250 |
| 2013/0074058 A1* | 3/2013 | Gounares | G06F 8/443 717/153 |
| 2014/0160961 A1* | 6/2014 | Dragulescu | H04L 43/0894 370/252 |
| 2015/0032437 A1* | 1/2015 | Kumar | G06F 17/5009 703/14 |
| 2015/0092549 A1* | 4/2015 | Anand | H04L 47/22 370/230.1 |
| 2016/0088499 A1* | 3/2016 | Logan | H04W 28/0215 370/242 |
| 2017/0061041 A1* | 3/2017 | Kumar | G06F 17/5009 |

FOREIGN PATENT DOCUMENTS

| | | |
|---|---|---|
| JP | H11136288 A | 5/1999 |
| JP | 2002101128 A | 4/2002 |
| JP | 3902606 B2 | 4/2007 |

OTHER PUBLICATIONS

Notification of Transmittal of the International Search Report and the Written Opinion of the International Searching Authority, or the Declaration for International Application No. PCT/US2017/038201 (dated Sep. 18, 2017).

Ixia Data Sheet, "Xcellon-Multis® QSFP 40/10GE Load Modules," https://www.ixiacom.com/sites/default/files/2016-05/xcellon-multis-qsfp-4010ge-load-modules.pdf, pp. 1-14 (May 2016).

Morton, "IMIX Genome: Specification of Variable Packet Sizes for Additional Testing," IETF RFC 6985, pp. 1-10 (Jul. 2013).

Ixia Solution Brief, "IxLoad," pp. 1-4 (Feb. 2012).

Commonly-assigned, co-pending U.S. Appl. No. 16/436,856 for "Methods, Systems, and Computer Readable Media for Generating and Using Statistically Varying Network Traffic Mixes to Test Network Devices," (Unpublished, filed Jun. 10, 2019)

"The World's Fastest & Most Programmable Networks," Barefoot Networks, pp. 1-14 (Copyright 2019).

"P416 Language Specification version 1.1.0," The P4 Language Consortium, pp. 1-147 (Nov. 30, 2018).

Notice of Allowance and Fee(s) Due for U.S. Appl. No. 13/962,666 (dated Feb. 9, 2015).

"Traffic Generators for Internet Traffic," https://www.icir.org/models/traficgenerators.html, pp. 1-3 (Sep. 2010).

Notice of Allowance and Fee(s) Due for U.S. Appl. No. 10/404,864 (dated Apr. 5, 2007).

Decision to grant a European patent pursuant to article 97(2) EPC for European Patent Application Serial No. 04251177.4 (dated Dec. 21, 2006).

Summons to attend oral proceedings pursuant to Rule 71(1) EPC for European Patent Application Serial No. 04251177.4 (Dec. 19, 2005).

Office Action for Japanese Patent Application Serial No. 2004-107997 (dated Apr. 25, 2006).

"Load Modules—Multilayer Glglbit Ethernet for LM1000LX, LM1000SX, LM1000GBIC, LM1000T," Ixia, Product Specification Sheet, 2 pages (Sep. 14, 2005).

Communication pursuant to Article 96(2) EPC for European Patent Application Serial No. 04 251 177.4 (dated Jun. 2, 2005).

European Search Report for European Patent Application Serial No. 04 25 1177 (dated Jun. 9, 2004).

Zec et al., "Real-Time IP Network Simulation at Gigabit Data Rates," Proceedings of the 7th International Conference on Telecommunications (ConTEL), pp. 1-8 (Jun. 2003)

Ye et al., "Large-Scale Network Parameter Configuration Using an On-line Simulation Framework," pp. 1-19 (2003).

Delgado-Restituo et al., "Integrated Chaos Generators," Proceedings of the IEEE, vol. 90, No. 5, pp. 747-767 (May 2002).

Kramer et al., "Interleaved Polling with Adaptive Cycle Time (IPACT): A Dynamic Bandwidth Distribution Scheme in an Optical Access Network," Photonic Network Communications, vol. 4, No. 1, pp. 89-107 (2002).

Ulanovs et al., "Modeling Methods of Self-Similar Traffic for Network Performance Evaluation," Scientific Proceeding of RTU, Series 7, Telecommunications and Electronics, pp. 40-49 (2002).

Wallerich, "Self-Similarity and Heavy Tailed Distributions," Design and Implementation of a WWW Workload Generator for the NS-2 Network Simulator (Chapter 2.2), NSWEB, 2 pages (Nov. 1, 2001).

Guo et al, "How Does TCP Generate Pseudo-self-similarity?," In Proceedings of the International Workshop on Analysis and Simulation of Computer and Telecommunications Systems, MASCOTS '01, 9 pages (Aug. 2001).

Kramer et al, "Interleaved Polling with Adaptive Cycle Time (IPACT): Protocol Design and Performance Analysis," pp. 1-37 (Jul. 2001).

Kramer, "Self-similar Network Traffic: The notions and effects of self-similarity and long-range dependence," http://wwwcsif.cs.ucdavis.edu/~kramer/papers/ss_trf_present2.pdf>, pp. 1-10 (May 21, 2001).

Kramer, "Generator of Self-Similar Network Traffic (version 2)," U.C. Davis, 3 pages (Apr. 4, 2001)

Sikdar et al., "The Effect of TCP on the Self-Similarity of Network Traffic," Proceeding of 35th Conference on Information Sciences and Systems, 6 pages (Mar. 2001).

Mondragón et al., "Chaotic maps for traffic modelling and queueing performance analysis," Performance Evaluatlon, vol. 43, pp. 223-240 (2001).

Sikdar et al., "On the contribution of TCP to the Self-Similarity of Network Traffic," Proceedings of IWDC, vol. 2170, pp. 596-613 (2001).

Kramer, "Generator of Self-Similar Network Traffic," U.C. Davis, 3 pages (Sep. 25, 2000).

(56) References Cited

OTHER PUBLICATIONS

Mandeville et al., "Benchmarking Methodology for LAN Switching Devices," RFC 2889, pp. 1-35 (Aug. 2000).
Veres et al, "The Chaotic Nature of TCP Congestion Control," Proceedings of IEEE INFOCOM, Tel-Aviv, 9 pages (Mar. 2000).
Kramer, "On Generating Self-Similar Network Traffic Using Pseudo-Pareto Distribution," Tutorial, U.C. Davis, 5 pages (2000).
Zhang et al., "Fractal Network Traffic: From Understanding to Implications," The 6th International Conference on Telecommunication Systems, Modeling and Analysis, 1 page (Mar. 1998).
Crovella et al., "Long-Lasting Transient Conditions in Simulations with Heavy-Tailed Workloads," Proceedings of the 1997 Winter Simulation Conference (WSC-97), pp. 1005-1012 (Dec. 1997).
Paxson, "Fast, Approximate Synthesis of Fractional Gaussian Noise for Generating Self-Similar Network Traffic," Computer Communication Review, vol. 27, No. 5, pp. 5-18 (Oct. 1997).
Samuel et al., "Fast Self-Similar Traffic Generation," Proceedings of the Fourteenth UK Teletraffic Symposium on Performance Engineering in Information Systems, Manchester UK, pp. 8/1-8/4 (Mar. 1997).
Willinger et al., "Self-Similarity Through High-Variability: Statistical Analysis of Ethernet LAN Traffic at the Source Level," IEEE/ACM Transactions on Networking, vol. 5, No. 1, pp. 71-86 (Feb. 1, 1997).
Taqqu et al, "Proof of a Fundamental Result in Self-Similar Traffic Modeling," 19 pages (1997).
Brakmo et al., "Experiences with Network Simulation," ACM Sigmetrics International Conference on Measurement and Modeling of Computer Systems, pp. 80-90 (May 23, 1996).
Willinger et al., "Self-Similarity and Heavy Tails: Structural Modeling of Network Traffic," pp. 1-26 (1996).
Willinger et al., "Self-Similarity Through High-Variability: Statistical Analysis of Ethernet LAN Traffic at the Source Level,"Proc. of the ACM/Sigcomm '95, 14 pages (1995).
Leland et al., "On the Self-Similar Nature of Ethernet Traffic (Extended Version)," IEEE/ACM Transactions on Networking, vol. 2, No. 1, pp. 1-15 (Feb. 1994).
Notice of Allowance and Fee(s) Due and Interview Summary for U.S. Appl. No. 09/906,882 (dated May 31, 2005).

\* cited by examiner

200 TRAFFIC SOURCE     TRAFFIC DESTINATION

- PORT1
- PORT2
- PORT3

- DUT1
- DUT2
- DUT3

202 TRAFFIC TYPE (CHECK ALL THAT APPLY)
- ☐ VOICE
- ☐ DATA
- ☐ VIDEO

204 SELECT OR DEFINE TRANSMISSION RATE FOR SIMULATED TRAFFIC

- 25 GBPS
- 50 GBPS
- 100 GBPS

206 SELECT OR DEFINE PACKET SIZE OR SIZE DISTRIBUTION

- 64 kilobyte
- 1500 kilobyte
- IMIX

*FIG. 2A*

TRAFFIC SOURCE

200

PORT 1
PORT2
PORT3

TRAFFIC DESTINATION

DUT1
DUT2
DUT3

TRAFFIC TYPE (CHECK ALL THAT APPLY)

202
- ☐ VOICE
- ☐ DATA
- ☐ VIDEO

204
SELECT OR DEFINE TRANSMISSION RATE FOR SIMULATED TRAFFIC

25 GBPS
50 GBPS
100 GBPS

SELECT OR DEFINE PACKET SIZE OR SIZE DISTRIBUTION 206
64 kilobyte
1500 kilobyte
IMIX

SELECT BURST PROFILE

208
LOW BURSTINESS
MEDIUM BURSTINESS
HIGH BURSTINESS

*FIG. 2B*

METHODS, SYSTEMS AND COMPUTER READABLE MEDIA FOR TESTING NETWORK DEVICES USING VARIABLE TRAFFIC BURST PROFILES

TECHNICAL FIELD

The subject matter described herein relates to testing communications network equipment. More particularly, the subject matter described herein relates to methods, systems, and computer readable media for testing network devices using variable traffic burst profiles.

BACKGROUND

In testing network devices, such as switches, routers, firewalls, network address translators, servers, storage devices, etc., it is desirable to send a mix of traffic to the devices that simulates the traffic that the devices would experience in live networks. For network devices that are intended to operate in networks that carry traffic of different types, such as voice, data, and video traffic, it is desirable to generate a mix of simulated traffic that includes all of these types. In addition, because network devices will encounter streams of different packet sizes in real world deployments, it is desirable to test devices with a mix of different packet sizes. For example, when performing a stress test of a network device, such as a firewall, it may be desirable to see how the device performs when receiving a stream of small packets, such as 64 kilobyte packets versus how the device performs when receiving a stream of larger packets, such as 1500 kilobyte packets.

Because a realistic mix of packets sizes is desirable during testing, efforts have been made to standardize test traffic mixes. For Internet connected devices, a mix of packet sizes for which some standardization efforts have occurred is referred to as an Internet mix or IMIX of packets. There is no standard IMIX of packets that is valid for all network devices, as different network devices see different mixes of packet sizes. However, IETF RFC 6985, entitled IMIX Genome, describes a method for specifying different Internet mixes of traffic.

As a result of the need to test network devices using different mixes of traffic, some network equipment test devices, such as the Ixia Xcellon load modules with IxNetwork software, are capable of generating an IMIX of simulated traffic where the simulated packets have different sizes. However, one feature that is not known to be implemented by current network equipment test devices is the ability to easily specify and implement burst profiles that vary in time for simulated network traffic. Current network test devices allow specification of a traffic rate, e.g., in bits per second, and a fixed time between successive packet transmissions. However, there is currently a need for a test device that facilitates implementation of variable and realistic burst profiles for simulated test traffic.

In light of these difficulties, there exists a need for methods, systems, and computer readable media for testing network devices using variable traffic burst profiles.

SUMMARY

A method for testing a network device using a variable traffic burst profile includes providing for user selection of at least one type of simulated traffic to be transmitted to a network device under test (DUT). The method further includes receiving user input regarding selection of the type of simulated traffic. The method further includes providing for user selection of a transmission rate for transmitting the simulated traffic to the DUT. The method further includes receiving user input regarding selection of the transmission rate. The method further includes transmitting the simulated traffic to the DUT according to the selected type, rate, and a variable traffic burst profile.

A system for testing a network device using a variable traffic burst profile includes a network equipment test device including at least one processor. The system further includes a user interface implemented by the at least one processor for providing for user selection of at least one type of simulated traffic to be transmitted to a network device under test (DUT), receiving user input regarding selection of the type of simulated traffic, providing for user selection of a transmission rate for transmitting the simulated traffic to the DUT, and receiving user input regarding selection of the transmission rate. The system further includes a simulated traffic generator for transmitting the simulated traffic to the DUT according to the selected type, rate, and a variable traffic burst profile.

The subject matter described herein for testing a network device using a variable burst profile may be implemented in hardware, software, firmware, or any combination thereof. As such, the terms "function" or "module" as used herein refer to hardware, software, and/or firmware for implementing the feature being described. In one exemplary implementation, the subject matter described herein may be implemented using a non-transitory computer readable medium having stored thereon computer executable instructions that when executed by the processor of a computer control the computer to perform steps. Exemplary computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

BRIEF DESCRIPTION OF THE DRAWINGS

Embodiments of the subject matter described herein will now be explained with reference to the accompanying drawings, wherein like reference numerals represent like parts, of which:

FIG. 2A is a line drawing of a user interface for providing for user specification of traffic type, transmission rate, and packet size distribution according to an embodiment of the subject matter described herein; and FIG. 2B is a line drawing of a user interface for providing for user specification of a variable traffic burst profile according to an embodiment of the subject matter described herein;

DETAILED DESCRIPTION

Figure 1:
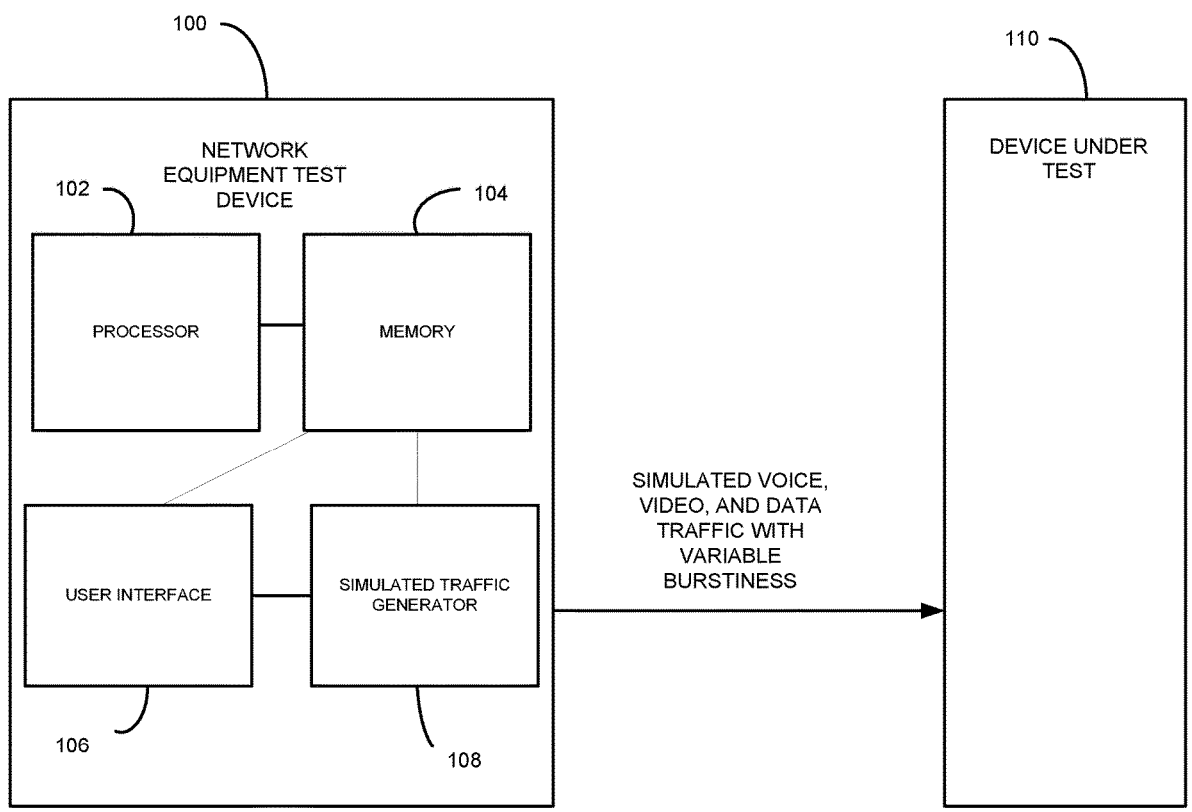
FIG. 1 is a block diagram illustrating an exemplary system for testing a network device using a variable traffic burst profile according to an embodiment of the subject matter described herein.

The subject matter described herein includes methods, systems, and computer readable media testing a network device using variable traffic burst profiles. FIG. 1 is a block diagram illustrating a system for testing a network device using a variable traffic burst profile according to an embodiment of the subject matter described herein. Referring to FIG. 1, a network equipment test device 100 includes at least one processor 102 and memory 104. Network equipment test device 100 further includes a user interface 106 and a simulated traffic generator 108. In one example, user interface 106 and simulated traffic generator 108 may be stored in memory 104 and executed by processor 102.

User interface 106 may be a graphical or command line interface that provides for user selection of at least one type of simulated traffic to be transmitted to DUT 110 and receives user input regarding selection of the type of simulated traffic. For example, user interface 106 may allow a user to define simulated traffic flows to be transmitted to DUT 110. A traffic flow is a group of packets that are transmitted to DUT 110 for test purposes. The traffic flow may include traffic of a single type, such as voice traffic or a mix of traffic types, such as voice, video, and/or data traffic.

FIG. 2A illustrates an example of elements that may be included in user interface 106 to allow definition of a simulated traffic flow. In FIG. 2A, user interface 106 includes a first portion 200 for allowing the user to define a simulated traffic flow, the transmitting interface of network interface test device 100 and the destination interface of DUT 110. User interface 106 further includes a second portion 202 for allowing the user to select a traffic type or types for the simulated traffic flow. In the illustrated example, second portion 202 is a menu that allows the user to select simulated data traffic, voice traffic, video traffic, or any combination thereof.

User interface 106 may also include a third portion 204 for user selection of a transmission rate for transmitting simulated traffic to DUT 110. For example, user interface 106 may provide a drop-down menu or other graphical or textual device through which a user can select a transmission rate, e.g., in bits per second. The transmission rate may be the line rate or rate at which bits are transmitted if the transmission line or medium is fully utilized without considering inter-packet delays or burstiness. For example, if it is desirable to simulate 50 or 100 gigabit Ethernet, the transmission rate selections provided by user interface 106 may include 50 Gbps and 100 Gbps. Alternatively, rather than specifying a menu of transmission rates, user interface 106 may allow a user to define a customized transmission rate by providing a dialog box for the user to enter the packet transmission rate.

User interface 106 may also provide for user selection of frame sizes for the simulated traffic flow. For example, user interface 106 may include a fourth portion 206 that allows the user to select a frame size, such as 64 k or 1500 k or a frame size distribution, such as IMIX. The frame size distributions may be tailored to a test scenario. For example, to achieve maximum stress on the device under test, a frame size distribution with a higher percentage of smaller framer frames. If it is desirable to simulate a realistic mix of Internet traffic, a more even distribution of frame sizes may be selected for the simulated traffic flow.

Once the user has select the traffic type(s) and transmission for a particular flow, in one embodiment, simulated traffic generator 108 automatically selects at least one burst profile for varying burstiness of the simulated traffic transmitted to the DUT, e.g., based on the selected traffic type(s), based on a desired test scenario, a burst level standard, etc., and transmits the simulated traffic to the DUT according to the selected rate, traffic, and selected burst profile selected. For example, a user may select voice, video, and data traffic for a particular type via user interface 106 and simulated traffic generator 106 may select a different burst profile for each of the voice, video, and data traffic. Simulated traffic generator 108 may then transmit traffic to the DUT using the burst profile select for each traffic type. In an alternate example, simulated traffic generator may select and apply the same traffic burst profile to all traffic types to simulate burstiness that occurs at a particular time of day.

In one example, rather than transmitting traffic where the inter-packet delay is constant, the inter-packet delays of the burst profiles selected and/or generated by simulated traffic generator 108 may vary with time. For example, simulated traffic generator 108 may use a probability distribution function or a random number generator to vary the inter-packet delays of a given profile. Simulated traffic generator 108 may store data for implementing a given burst profile in memory 104 for subsequent use in generating the simulated traffic with the given burst profile. Table 1 shown below illustrates exemplary data that may be stored in memory 104 for generating a given traffic burst profile.

TABLE 1

Inter-Packet Delays for Implementing Variable Burst Profile

| Packet | Inter-Packet Delay |
|---|---|
| 0 | 1 |
| 1 | 3 |
| 2 | 4 |
| 3 | 2 |
| 4 | 1 |
| 5 | 0 |
| 6 | 0 |
| 7 | 0 |

In Table 1, each delay value represents a number of units of packet delay between successive packet transmissions. In one example, each unit of packet delay may be a bit transmission time at line rate. For example, if the line rate is 100 Gbps, an inter-packet delay of 1 indicates $1/10^9$ seconds. Multiple successive inter-packet delays of 0 may indicate a burst of data packets at line rate. Data such as that illustrated in Table 1 may be generated and stored in memory 104 to implement different burst profiles for different traffic types or for the same traffic types. The inter-packet delays used for each table may be generated using a random number generator or a probability distribution function.

The subject matter described herein is not limited to automatically selecting burst profiles based on traffic types selected by the user. In an alternate implementation, user interface 106 may provide for user selection of burst profiles and receive user input regarding the selection. Simulated traffic generator 106 may then generate simulated traffic using the burst profile selected by the user. For example, user interface 106 may provide a menu or other construct for selecting a burst profile. FIG. 2B illustrates an example of an exemplary user interface through which the user may select from among plural burst profiles. Referring to FIG. 2B, a burst profile menu 208 may include burst profiles for heavy, intermediate and light network usage times. Traffic may be more bursty, and the burstiness may be more variable in heavy network usage times due to queuing delays in network switches. Traffic may be less bursty, and the burstiness may be less variable in lighter network usage times. User interface 106 may provide for user selection of burst profiles that simulate burstiness that occurs in a variety of network conditions, including different amounts of relative usage. The burstiness profiles provided by user interface 106 may be standardized to allow network equipment manufacturers to evaluate device performance against the burstiness standard.

User interface 106 may provide for user selection of burst profile and other parameters on a per port basis. For example, user interface 106 may allow the user to specify that all ports of network equipment test device 100 start with the same static transmission rate and then gradually ramp up to a new traffic rate. The different ports may be configurable to ramp up to the same or different traffic rate. The rate of ramping to the new transmission rate may be the same or different on each port. In addition, providing for selection or implementation of packet transmission rates that vary in time using functions other than ramp functions is intended to be within the scope of the subject matter described herein.

Figure 3:
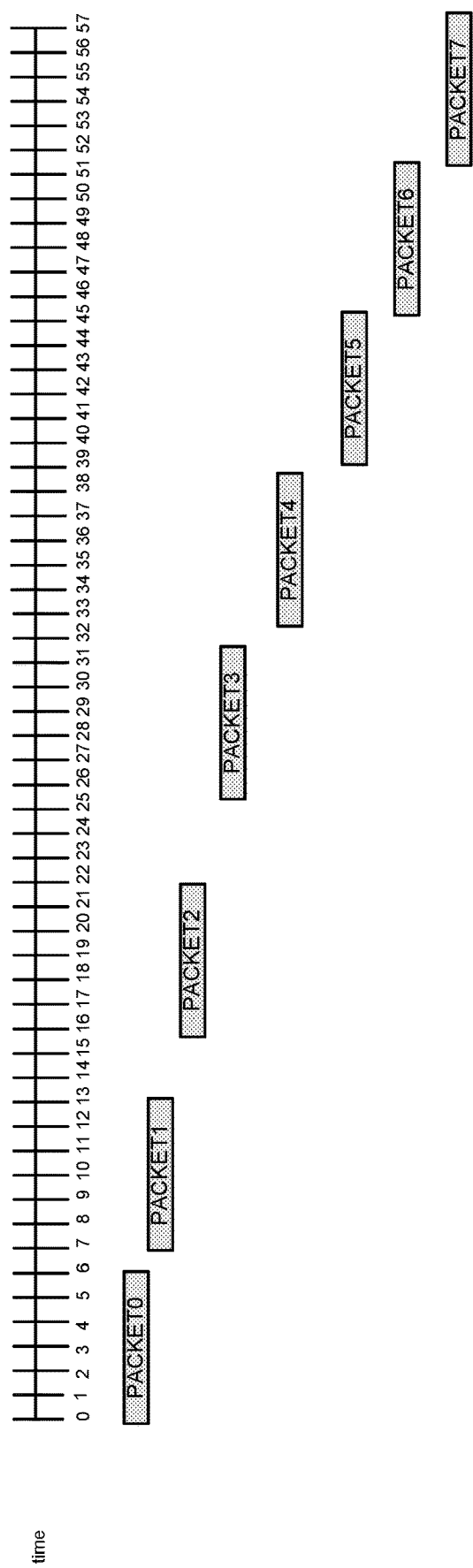
FIG. 3 is a block diagram of illustrating transmission of packets to a network device under test using a variable traffic burst profile according to an embodiment of the subject matter described herein.

In one example, network equipment test device 100 generates and utilizes burst profiles that result in transmission of simulated traffic to DUT 110 with time varying inter-packet transmission times. FIG. 3 is a block diagram illustrating transmission of packets to a network device under test using a variable burst profile according to an embodiment of the subject matter described herein. Referring to FIG. 3, the inter-packet transmission times vary according to the data illustrated in Table 1. It can be seen from FIG. 3 that packets 5, 6, and 7 are transmitted back-to-back (i.e., without any inter-packet transmission delays), which simulates a burst of packet transmissions to the device under test.

As illustrated in FIG. 3, the burstiness of a given burstiness profile may vary in time during a test. In addition, user interface 106 and/or simulated traffic generator 108 may provide for application of multiple different burstiness profiles during a test. For example, simulated traffic generator may start a packet flow with a low burstiness profile, switch to an intermediate burstiness profile, and then switch to a high burstiness profile during the same test to evaluate the performance of a device under test under different burstiness scenarios. User interface 106 may also provide for a user to dynamically change a burstiness profile during a test. For example, if a test begins with a low burstiness profile, user interface 106 may provide a pop-up menu or other construct that allows the user to change the burstiness profile of the packets transmitted to the DUT during a test.

Figure 4:
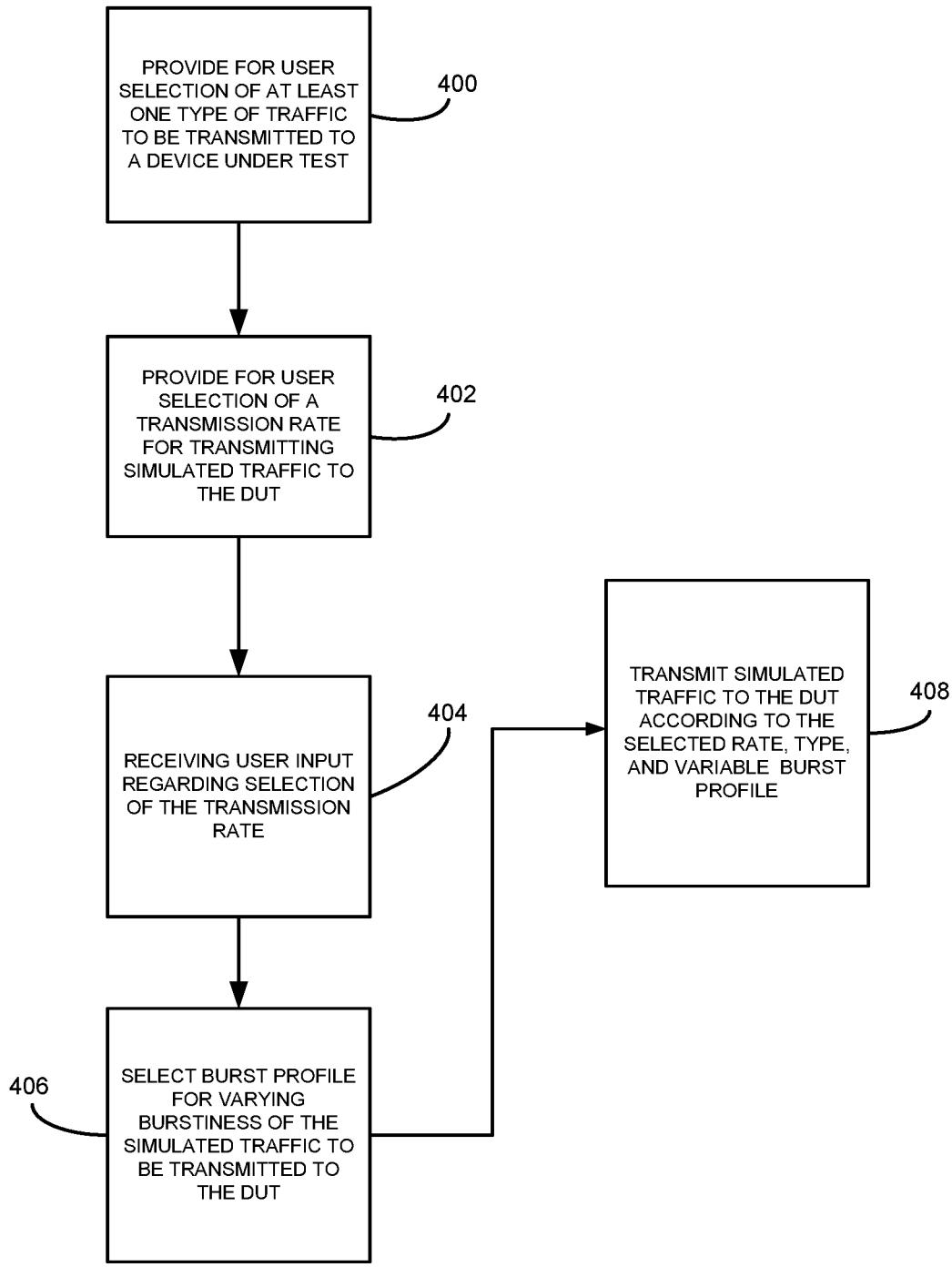
FIG. 4 is a flow chart illustrating an exemplary process for testing a network device using a variable traffic burst profile according to an embodiment of the subject matter described herein.

FIG. 4 is a flow chart illustrating an exemplary process for testing a network device using a variable traffic burst profile according to an embodiment of the subject matter described herein. Referring to FIG. 4, in step 400, the process includes providing for user selection of at least one type of simulated traffic to be transmitted to a DUT. For example, user interface 106 may allow the user to select one or more simulated traffic types, such as voice, video, and/or data traffic.

In step 402, the process includes receiving user input regarding selection of the type of simulated traffic. For example, user interface 106 may receive input from the user that indicates the user desires to transmit simulated voice, video, and data traffic to DUT 110.

In step 404, the process includes providing for user selection of a transmission rate for transmitting the simulated traffic to the DUT. For example, user interface 106 may provide a menu or other construct that allows the user to select a line rate (e.g., in bits per second) for transmitting packets to DUT 110.

In step 406, the process includes receiving user input regarding selection the transmission rate. For example, user interface 106 may receive user input that indicates the user's selection of the transmission rate, such as 100 Gbps.

In step 408, the process includes selecting a burst profile for varying burstiness of the simulated traffic transmitted to the DUT. In one example, simulated traffic generator 108 may select the burst profile automatically based on traffic type(s) and standard or predefined burst profiles for each traffic type. In another example, simulated traffic generator 108 may select the same burst profile to be applied across multiple traffic types. In yet another example, user interface 106 may provide for user selection of the burst profile on an aggregate or per traffic type basis, and simulated traffic generator 108 may use the selected burst profile to generate the simulated traffic.

In step 410, the process includes transmitting the simulated traffic to the DUT according to the selected type, rate, and burst profile. For example, test traffic generator 108 may transmit the simulated traffic to DUT 110 using the automatically or manually selected traffic burst profile.

It will be understood that various details of the subject matter described herein may be changed without departing from the scope of the subject matter described herein. Furthermore, the foregoing description is for the purpose of illustration only, and not for the purpose of limitation.

What is claimed is:

1. A method for testing a network device using a variable traffic burst profile, the method comprising:
in a network equipment test device including at least one processor:
providing a first portion graphical user interface including a plurality of selectable menu items corresponding to a plurality of different types of simulated traffic to be transmitted to a network device under test (DUT);
receiving, via the first portion of the graphical user interface, user selection of one of the selectable menu items in the first portion corresponding to a specific type of simulated traffic;
providing a second portion of the graphical user interface including a plurality of selectable menu items corresponding to a plurality of different transmission rates for transmitting the simulated traffic to the DUT;
receiving, via the second portion of the graphical user interface, user selection of one of the selectable menu items in the second portion corresponding to a specific transmission rate for transmitting the simulated traffic to the DUT;
providing a third portion of the graphical user interface for user selection of a traffic burst profile that maps to a plurality of different inter-packet delay values, wherein providing the third portion of the graphical user interface includes displaying a burst profile menu that includes a plurality of selectable menu items corresponding to different variable traffic burst profiles, the selectable menu items in the third portion including at least a first selectable menu item corresponding to a first variable traffic burst profile and a second selectable menu item corresponding to a second variable traffic burst profile having a higher burstiness than the first variable traffic burst profile;

receiving, via the third portion of the graphical user interface, user selection of one of the selectable menu items in the third portion corresponding to a specific variable traffic burst profile;

wherein the selectable menu items in the third portion of the graphical user interface are independently selectable from the selectable menu items in the first and second portions and the selectable menu items in the second portion are independently selectable from the selectable menu items in the first portion such that the specific traffic type, specific rate, and the specific variable traffic burst profile are independently selectable;

transmitting the simulated traffic to the DUT having the specific traffic type selected by the user via the first portion of the graphical user interface, the specific transmission rate selected by the user via the second portion of the graphical user interface, and the specific variable traffic burst profile that utilizes the inter-packet delay values that map to the specific variable traffic burst profile corresponding to the selectable menu item selected by the user via the menu of selectable menu items displayed in the third portion of the graphical user interface to vary transmission times between simulated packets.

2. The method of claim 1 wherein the selectable menu items in the first portion of the graphical user interface include selectable menu items corresponding to each of simulated voice, video, and data traffic.

3. The method of claim 2 wherein the selectable menu items in the second portion of the graphical user interface include selectable menu items corresponding to different simulated traffic transmission rates in bits per second.

4. The method of claim 3 wherein the selectable menu items in the third portion of the graphical user interface include selectable menu items corresponding to low, medium, and high variable traffic burstiness profiles.

5. The method of claim 1 comprising receiving user input selecting a plurality of different traffic types to be transmitted to the DUT and wherein transmitting the traffic to the DUT includes transmitting the traffic using the same traffic burst profile for the different traffic types.

6. The method of claim 1 comprising generating and storing, in memory of the network equipment test device, data for implementing a plurality of different variable traffic burst profiles, wherein transmitting the simulated traffic according to the specific variable traffic burst profile includes using the data stored in the memory implementing the specific variable traffic burst profile to vary inter-packet transmission times of simulated packets.

7. The method of claim 6 wherein generating the data for implementing the different variable traffic burst profiles includes generating the data according to a probability distribution function or a random number generator.

8. The method of claim 1 wherein the network equipment test device includes a plurality of ports and wherein the method further comprises varying a transmission rate on a per port basis.

9. A system for testing a network device using a variable traffic burst profile, the system comprising:
a network equipment test device including:
at least one processor;
a graphical user interface implemented by the at least one processor and including a first portion including a plurality of selectable menu items corresponding to a plurality of different types of simulated traffic to be transmitted to a network device under test (DUT) and for receiving user selection of one of the selectable menu items in the first portion corresponding to a specific type of simulated traffic, the graphical user interface further including a second portion including a plurality of selectable menu items corresponding to a plurality of different transmission rates for transmitting the simulated traffic to the DUT, and for receiving user input regarding selection of one of the selectable menu items in the second portion corresponding to a specific transmission rate for transmitting the simulated traffic to the DUT, and the graphical user interface further including a third portion for user selection of a traffic burst profile that maps to a plurality of different inter-packet delay values and for receiving user selection of a traffic burst profile, wherein the third portion of the graphical user interface displays a traffic burst profile menu that includes a plurality of selectable menu items corresponding to different variable traffic burst profiles, the selectable menu items in the third portion including at least a first selectable menu item corresponding to a first variable traffic burst profile and a second selectable menu item corresponding to a second variable traffic burst profile having a higher burstiness than the first variable traffic burst profile, wherein receiving user selection of the traffic burst profile includes receiving user selection of one of the selectable menu items in the third portion corresponding to a specific variable traffic burst profile;

wherein the selectable menu items in the third portion of the graphical user interface are independently selectable from the selectable menu items in the first and second portions and the selectable menu items in the second portion are independently selectable from the selectable menu items in the first portion such that the specific traffic type, specific rate, and the specific variable traffic burst profile are independently selectable; and a simulated traffic generator for transmitting the simulated traffic to the DUT having the specific traffic type selected by the user via the first portion of the graphical user interface, the specific transmission rate selected by the user via the second portion of the graphical user interface, and the specific variable traffic burst profile including the inter-packet delay values that map to the specific variable traffic burst profile corresponding to the selectable menu item selected by the user via the menu of selectable menu items displayed in the third portion of the graphical user interface.

10. The system of claim 9 wherein selectable menu items in the first portion of the graphical user interface include selectable menu items corresponding to each of simulated voice, video, and data traffic.

11. The system of claim 10 wherein the selectable menu items in the second portion of the graphical user interface include selectable menu items corresponding to a plurality of different traffic transmission rates in bits per second.

12. The system of claim 11 wherein the selectable menu items in the third portion of the graphical user interface include selectable menu items corresponding to low, medium, and high variable traffic burstiness profiles.

13. The system of claim 9 wherein the user interface is configured to receive user input selecting a plurality of different traffic types to be transmitted to the DUT and wherein the simulated traffic generator is configured to use the same traffic burst profile for each of the different traffic types.

14. The system of claim 9 wherein the simulated packet generator is configured to generate and store, in memory of the network equipment test device, data for implementing a plurality of different variable traffic burst profiles and use the data stored in the memory for implementing the specific variable traffic burst profile to vary inter-packet transmission times of the simulated packets.

15. The system of claim 14 wherein the simulated packet generator is configured to generate the data for implementing the different variable traffic burst profiles according to a probability distribution function or a random number generator.

16. The system of claim 9 wherein the network equipment test device includes a plurality of ports and the simulated traffic generator is configured to vary a transmission rate on a per port basis.

17. A non-transitory computer readable medium having stored thereon executable instructions that when executed by the processor of a computer control the computer to perform steps comprising:

providing a first portion graphical user interface including a plurality of selectable menu items corresponding to a plurality of different types of simulated traffic to be transmitted to a network device under test (DUT);

receiving, via the first portion of graphical user interface, user selection of one of the selectable menu items in the first portion corresponding to a specific type of simulated traffic;

providing a second portion of the graphical user interface including a plurality of selectable menu items corresponding to a plurality of different transmission rates for transmitting the simulated traffic to the DUT;

receiving, via the second portion of the graphical user interface, user selection of one of the selectable menu items in the second portion corresponding to a specific transmission rate for transmitting the simulated traffic to the DUT;

providing a third portion of the graphical user interface for selection of a traffic burst profile that maps to a plurality of different inter-packet delay values, wherein providing the third portion of the graphical user interface includes displaying a burst profile menu that includes a plurality of selectable menu items corresponding to different variable traffic burst profiles, the selectable menu items in the third portion including at least a first selectable menu item corresponding to a first variable traffic burst profile and a second selectable menu item corresponding to a second variable traffic burst profile having a higher burstiness than the first variable traffic burst profile;

receiving, via the third portion of the graphical user interface, user selection of one of the selectable menu items in the third portion corresponding to a specific traffic burst profile;

wherein the selectable menu items in the third portion of the graphical user interface are independently selectable from the selectable menu items in the first and second portions and the selectable menu items in the second portion are independently selectable from the selectable menu items in the first portion such that the specific traffic type, specific rate, and the specific variable traffic burst profile are independently selectable;

transmitting the simulated traffic to the DUT having the specific traffic type selected by the user via the first portion of the graphical user interface, the specific transmission rate selected by the user via the second portion of the graphical user interface and the specific variable traffic burst profile that utilizes the inter-packet delay values that map to the specific traffic burst profile corresponding to the selectable menu item selected by the user via the menu of selectable menu items displayed in the third portion of the graphical user interface to vary transmission times between simulated packets.

* * * * *